United States Patent [19]
White

[11] Patent Number: 6,088,402
[45] Date of Patent: *Jul. 11, 2000

[54] QAM SPREAD SPECTRUM DEMODULATION SYSTEM

[75] Inventor: Peter John White, Figtree, Australia

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/688,745

[22] Filed: Jul. 31, 1996

[30] Foreign Application Priority Data

Aug. 1, 1995 [AU] Australia ............... PN 4556

[51] Int. Cl.$^7$ .................. H04L 27/14; H04L 27/16
[52] U.S. Cl. ............... 375/326; 375/373; 329/304
[58] Field of Search .................. 375/316, 324, 375/326, 327, 371, 373; 329/304, 306

[56] References Cited

U.S. PATENT DOCUMENTS

| | | | |
|---|---|---|---|
| 4,100,503 | 7/1978 | Lindsey et al. | 331/1 A |
| 4,338,574 | 7/1982 | Fujita et al. | 331/1 A |
| 4,571,550 | 2/1986 | Head | 329/50 |
| 4,574,244 | 3/1986 | Head | 329/50 |
| 4,574,246 | 3/1986 | Yoshida | 329/124 |
| 4,581,601 | 4/1986 | Calderbank et al. | 340/347 DD |
| 4,613,977 | 9/1986 | Wong et al. | 375/327 |
| 4,646,326 | 2/1987 | Backof, Jr. et al. | 375/261 |
| 4,648,100 | 3/1987 | Mardirosian | 375/332 |
| 4,683,578 | 7/1987 | Betts et al. | 375/345 |
| 4,687,999 | 8/1987 | Desperben et al. | 329/109 |
| 4,796,188 | 1/1989 | Gale et al. | 364/443 |
| 4,827,489 | 5/1989 | Doi et al. | 375/340 |
| 4,860,316 | 8/1989 | Tanenaka et al. | 375/261 |
| 4,860,320 | 8/1989 | Hoffmann | 375/329 |
| 4,864,244 | 9/1989 | Sasaki | 329/304 |
| 4,899,364 | 2/1990 | Akazawa et al. | 375/1 |
| 4,958,360 | 9/1990 | Sari | 375/97 |
| 5,005,186 | 4/1991 | Aono et al. | 375/262 |
| 5,113,142 | 5/1992 | Yoshikawa | 329/306 |
| 5,126,682 | 6/1992 | Weinberg et al. | 329/304 |
| 5,128,960 | 7/1992 | van Driest et al. | 375/1 |
| 5,131,006 | 7/1992 | Kamerman et al. | 375/1 |
| 5,138,272 | 8/1992 | Le Polozec et al. | 329/304 |
| 5,140,613 | 8/1992 | Birgenheier et al. | 375/308 |
| 5,177,767 | 1/1993 | Kato | 375/1 |
| 5,237,587 | 8/1993 | Schoolcraft | 375/1 |
| 5,253,271 | 10/1993 | Montgomery | 375/59 |
| 5,276,685 | 1/1994 | Kepler et al. | 370/95.3 |
| 5,299,231 | 3/1994 | Guglielmi et al. | 375/344 |
| 5,311,546 | 5/1994 | Paik et al. | 375/232 |
| 5,315,618 | 5/1994 | Yoshida | 375/94 |
| 5,329,283 | 7/1994 | Smith | 342/25 |
| 5,347,569 | 9/1994 | Yamamoto | 375/261 |

FOREIGN PATENT DOCUMENTS

| | | |
|---|---|---|
| 378719 | 7/1990 | European Pat. Off. . |
| 421601 | 4/1991 | European Pat. Off. . |
| 3-034746 | 2/1991 | Japan . |
| 3-44247 | 2/1991 | Japan . |
| 4-033443 | 2/1992 | Japan . |
| 5-304514 | 11/1993 | Japan . |
| 6-030066 | 2/1994 | Japan . |
| 6-261084 | 9/1994 | Japan . |
| 2188817 A | 7/1987 | United Kingdom . |
| 8807302 | 9/1988 | WIPO . |

*Primary Examiner*—Tesfaldet Bocure
*Assistant Examiner*—Bryan Webster
*Attorney, Agent, or Firm*—Fitzpatrick, Cella, Harper & Scinto

[57] ABSTRACT

A demodulation arrangement is disclosed which comprises a mixing circuit for deriving in-phase (I) and quadrature (Q) signals in a digital form from a received signal. The I and Q signals can then be input to a look-up table configured to output at least a data output value corresponding to a symbol constellation point and a corresponding phase output value, both selectable using. A phase processor is arranged to receive the phase output value and to calculate a phase angle value of the received signal. The phase angle value is returned as a further input to the look-up table to supplement the I and Q signals for selection of at least the data output value.

27 Claims, 13 Drawing Sheets

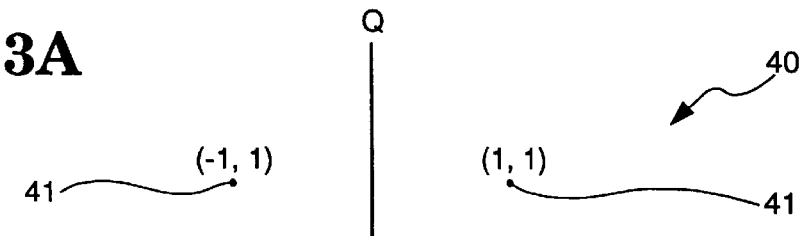
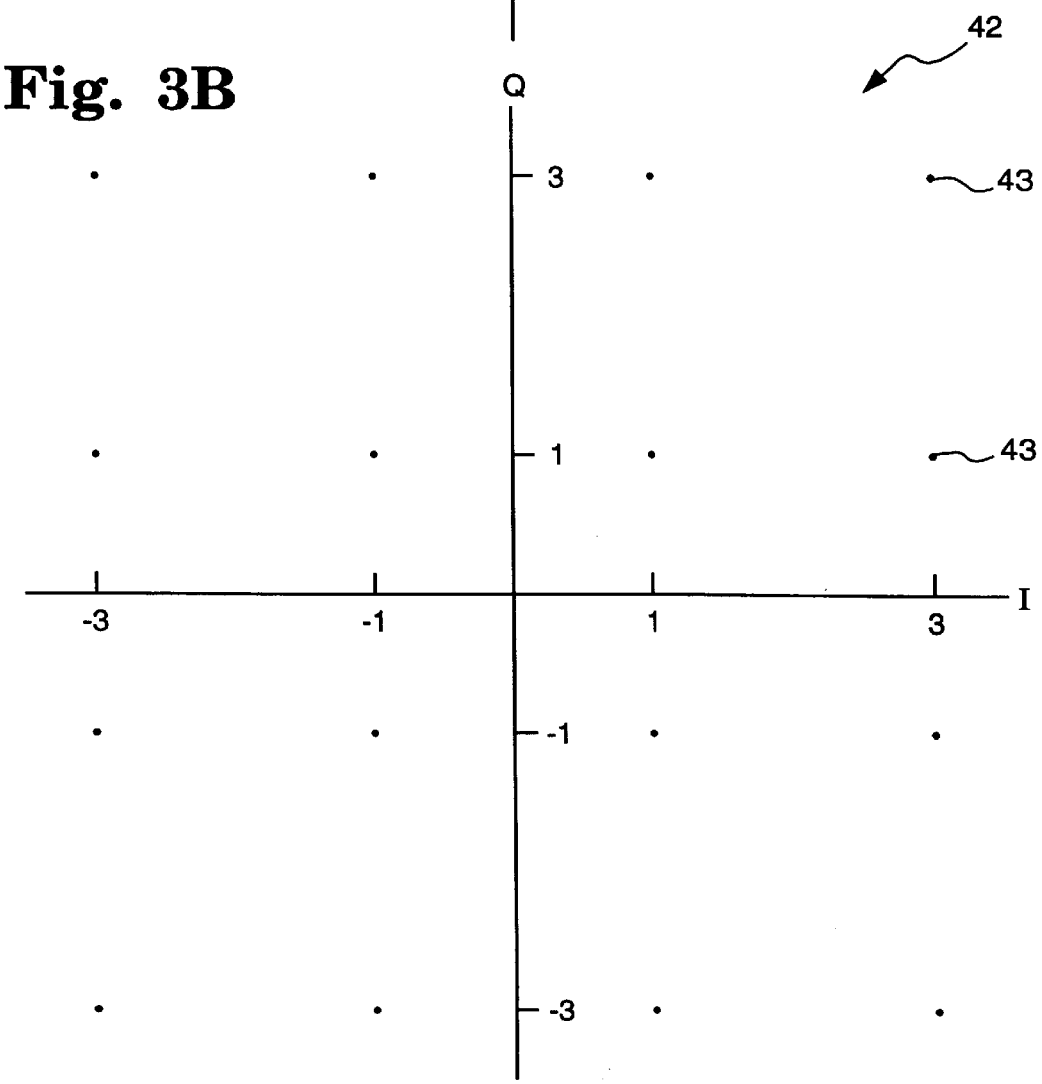

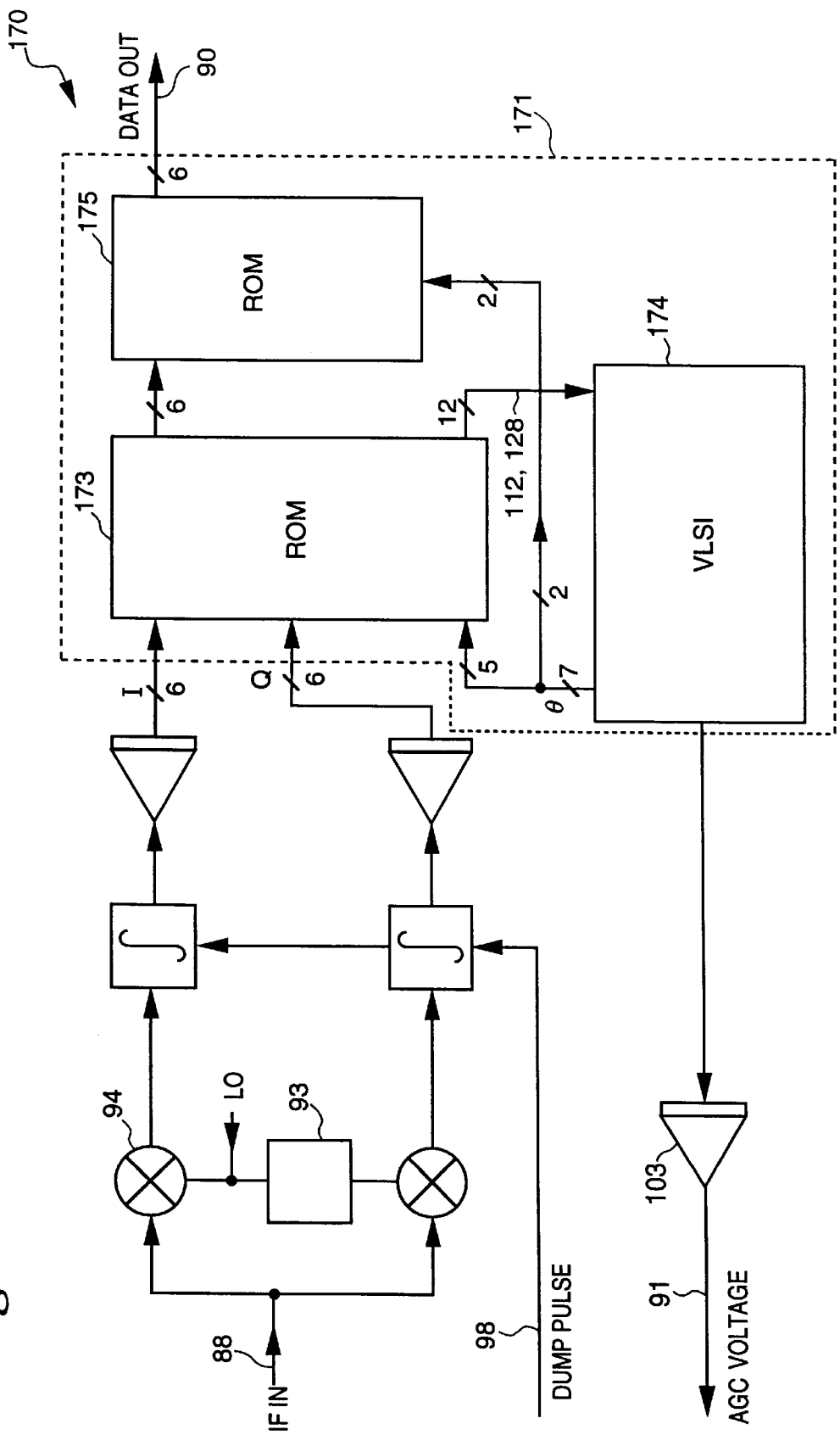

QAM SPREAD SPECTRUM DEMODULATION SYSTEM

FIELD OF THE INVENTION

The present invention relates generally to radio frequency (RF) communication systems and, in particular, discloses a quadrature amplitude modulation QAM spread spectrum demodulation system suitable for general application, but also finding particular application in wireless local area networks.

BACKGROUND ART

Associated with increases in office automation based around computer networks over the past ten years, there has developed an increasing desire to reduce, and ultimately to eliminate, data cable connections between devices such as main frame computers, terminals, personal computers, printers and the like. This has resulted in the development of so-called "wireless local area networks" (wireless LAN's), which utilise bi-directional radio frequency (RF) communications between devices arranged within such a system. Such systems present essentially three basic problems that have hampered their development. Firstly, in view of the number of individual number of equipments generally used in such a system, the hardware cost of any RF transceiver to be associated with each item of equipment should be minimized to ensure cost effectiveness. Further, the desired data rate, which is currently approximately 2 megabits per second (Mbps), and which is anticipated to increase to approximately 10 Mbps by the year 2000 generally necessitates microwave transmission frequencies, which are typically used for point-to-point communications over substantially larger distances. The third requirement is that of transmitter power. On this last point, the transmitted power level must be sufficiently low to fall within acceptable limits of environmental radiation hazards associated with office work places, and yet have sufficient power to achieve adequate propagation.

QAM spread spectrum systems when implemented at a high level, for example 64 QAM, have the advantages of being able to provide a high spectral efficiency which allow data rates in excess of 10 Mbps to be achieved whilst meeting the processing gain requirements established by United States Regulation FCC15.247, and a similar Japanese regulation, in a bandwidth of less than 26 MHz. Also, such systems provide an improved peak/average power ratio relative to other known transmission systems.

However, such systems have disadvantages. In particular, the traditional implementation of 64 QAM demodulation with a symbol rate of around 2 Mbps is complex, and as a result, not generally suited to the size and power requirement necessary for wireless LANs. Further, the low distance between symbols in a 64 QAM constellation causes susceptibility to multi-path effects, otherwise known as frequency selective fading. Additionally, 64 QAM is highly susceptible to amplitude modulation to phase modulation (AM/PM) conversion that occurs within the power amplifier of the RF transmitter. Traditional techniques to overcome this problem include designing expensive, highly linear power amplifiers, or alternatively operating power amplifiers approximately 10 dB below the rated output. Such techniques generally do not meet the cost-requirements for wireless LAN applications.

U.S. Pat. No. 5,005,186 (Aono et al) discloses a quadrature amplitude modulation (QAM) spread spectrum demodulator which permits high data rate and relatively low cost implementation through the use of a read-only-memory (ROM) which operates for constellation decoding and to provide error correction signals. However, such an arrangement is understood to be configured for microwave point-to-point applications and is generally unsuitable to wireless LAN environments.

Accordingly, it would be advantageous to provide a radio frequency transmission system which at least ameliorates the deficiencies mentioned above and thereby permits implementation in wireless LAN applications.

SUMMARY OF THE INVENTION

In accordance with one aspect of the present invention there is disclosed a demodulation arrangement comprising:

a mixing circuit for deriving in-phase (I) and quadrature (Q) signals in a digital form from a received signal, a look-up table comprising a plurality of data output values and phase output values and configured to output at least a data output value corresponding to a symbol constellation point and a corresponding phase output value, both selectable using the I and Q signals, and a phase processor arranged to receive the phase output value and to calculate a phase angle value of the received signal, wherein the phase angle value is further input to the look-up table to supplement the I and Q signals for selection of at least the data output value.

In accordance with another aspect of the present invention there is disclosed a demodulation apparatus comprising a ROM in which data values and phase values are stored for selection by I and Q input data, a phase processor for determining, from a plurality of the phase values, a current phase angle of the I and Q input data, and a feedback path by which the current phase angle is input directly to the ROM for modifying the I and Q values prior to the selection.

In accordance with another aspect of the present invention there is disclosed a QAM demodulation apparatus comprising a ROM configured for decoding symbol constellation points from a received signal, characterised in that a feedback path is formed from and returning directly to the ROM, the feedback path implementing a digital carrier recovery loop incorporating a complex multiplication function.

In accordance with another aspect of the present invention there is disclosed a method of demodulating a modulated signal, the method comprising the steps of:

(a) deriving in-phase (I) and quadrature (Q) signals from the signal;

(b) obtaining a decoded data output value and a phase output value corresponding to the I and Q signals;

(c) determining a phase angle value of the signal from the phase output value; and (d) using the phase angle value in concert with the I and Q signals in the obtaining of at least the decoded data output value.

BRIEF DESCRIPTION OF THE DRAWINGS

A number of aspects of the background art, and a number of preferred embodiments of the present invention will now be described with reference to the drawings in which:

FIGS. 3A to 3C illustrate respectively QPSK (4 QAM), 16 QAM and 64 QAM signal constellations;

FIG. 12 is a schematic block diagram representation of an alternative embodiment which uses post processing.

DETAILED DESCRIPTION

Figure 1:
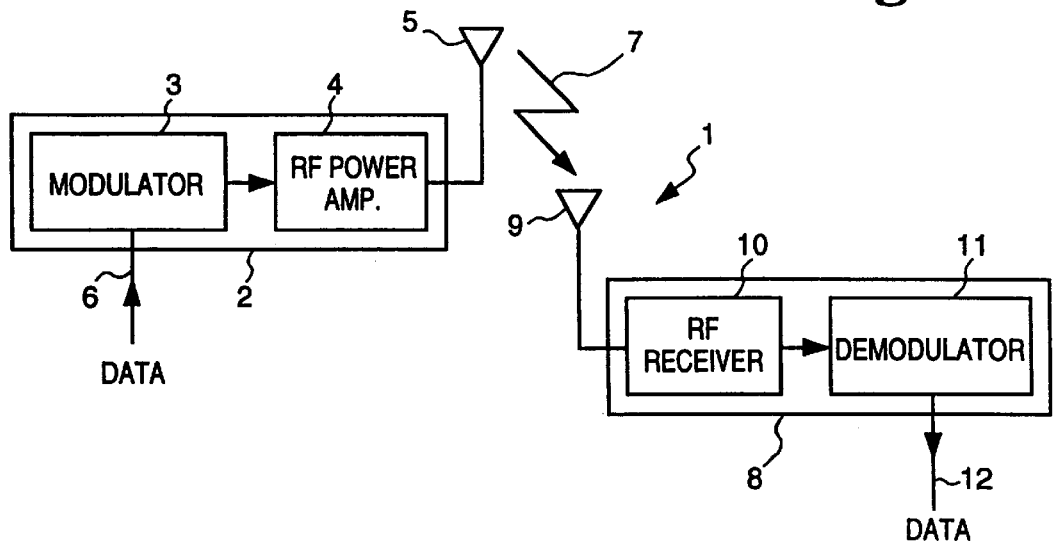
FIG. 1 is a schematic block diagram representation of an RF transmission system of conventional structure, and also which permits implementation using apparatus configured in accordance with the preferred embodiment.

FIG. 1 shows a communication system 1 configured for point-to-point communication between a transmitter 2 arranged at one location and a receiver 8 located at another. The transmitter 2 incorporates a modulator 3 which receives input data 6 and which outputs to an RF power amplifier 4 that is coupled to an antenna 5. The antenna 5 emits a transmitted signal 7 which is detected by an antenna 9 coupled to a radio frequency receiver 10 incorporated within a receiver 8. The RF receiver 10 outputs to a demodulator 11 which reproduces output data 12 from the transmitted signal.

The system 1 can be configured with any form of modulation system however, when used for microwave point to point communications, QAM is often used in view of it providing a high data rate. Furthermore, in such applications the relative cost of equipment is small compared to the distances travelled by communications signals and the volume of traffic that can be carried.

Figure 2:
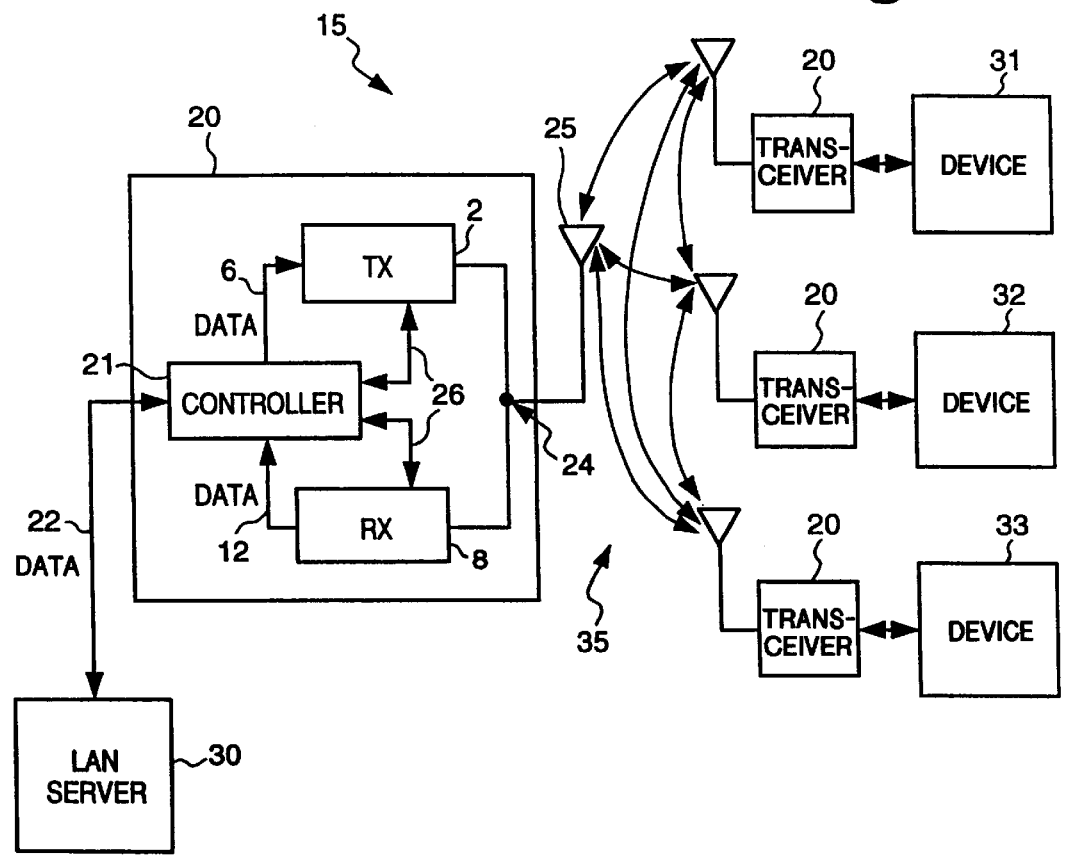
FIG. 2 is a schematic block diagram representation of a local wireless LAN in which the preferred embodiment can be used.

FIG. 2 illustrates a wireless LAN 15 which incorporates transceiver modules 20 each configured with a transmitter 2 and receiver 8 of the arrangement of FIG. 1. In this case, the modules 20 incorporate a controller 21 which receives bi-directional data 22 and provides the data input 6 to the transmitter 2, and receives the data output 12 from the receiver 8. The transmitter 2 and receiver 8 each couple to a RF transceiver terminal 24 to which an antenna 25 is used for the transmission and reception of transmission signals 35. Control lines 26 arranged between the controller 21, the transmitter 2 and the receiver 8 permit the selective operation of those devices to permit ordered bi-directional communication throughout the network 15. Each of the transceiver modules 20 is connected to an appropriate device such as a LAN server 30, or devices 31, 32 and 33 respectively, which can be personal computers, printers, main frame computers, a connection to wide area network, and the like.

Referring to FIG. 3A, the simplest form of QAM is quadrature phase shift keying (QPSK) which provides a signal constellation 40 having four constellation points 41. In some instances, QPSK is known as 4 QAM.

FIG. 3B illustrates a 16 QAM signal constellation 42 which includes sixteen constellation points 43 distributed in the manner shown.

Figure 3C:
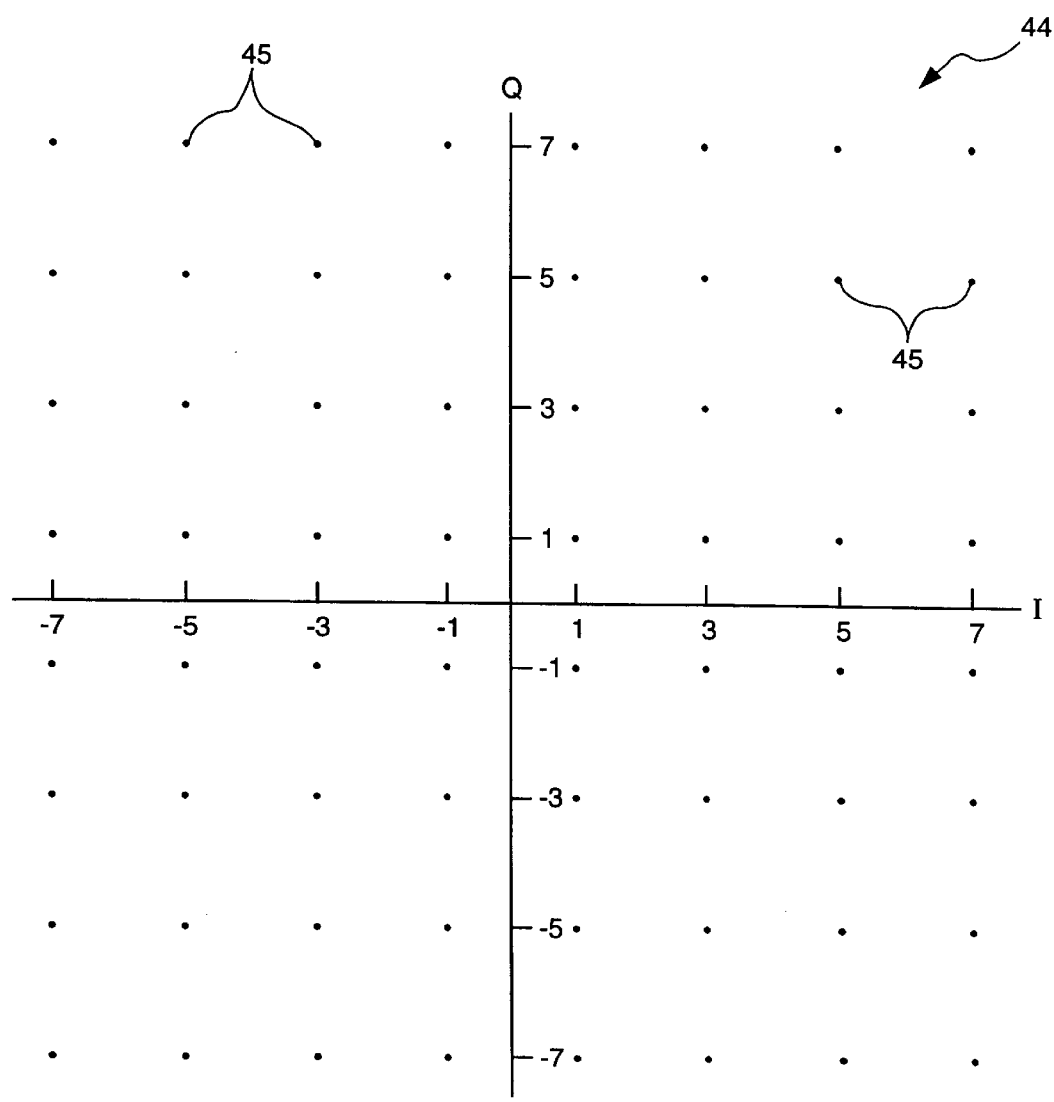

FIG. 3C illustrates a 64 QAM signal constellation 44 which includes sixty-four constellation points 45 also distributed in the manner shown.

Figure 3D:
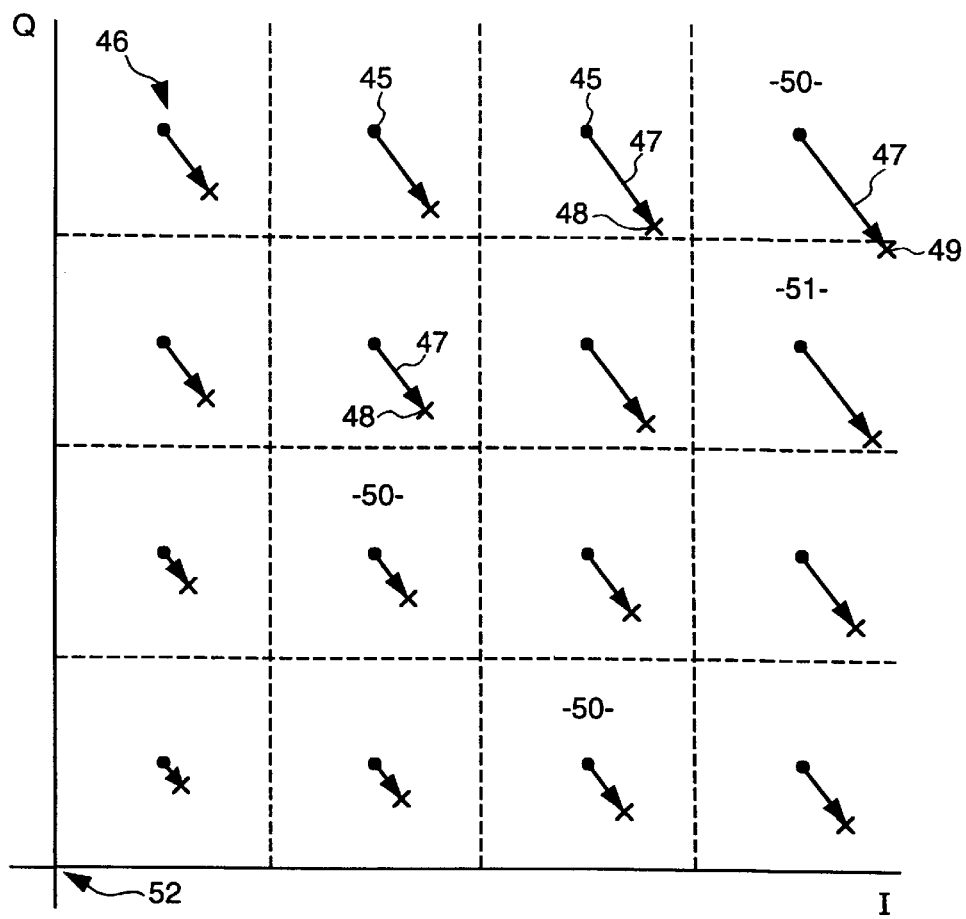
FIG. 3D illustrates the effects of AM/PM conversion on one quadrant of the constellation of FIG. 3C.

FIG. 3D illustrates the effects of effects of AM/PM conversion on the ideal constellation points 45 of one quadrant 46 of the constellation 44 of FIG. 3C. When subjected to AM/PM conversion, an error vector 47 is applied to each ideal constellation point 45 which causes the corresponding real constellation point 48 to be displaced from its ideal location 45. It will be appreciated from FIG. 3D, that the magnitude of the vectors 47 increase with the greater distance of the constellation points 45 from the origin 52 of the constellation 44. Importantly, in digital QAM systems, each constellation point represents a quantized transmitted value. Accordingly, schematically illustrated about each of the constellation points 45 is a home constellation box 50 such that any constellation point detected in that box will be interpreted as the corresponding ideal constellation point 45. Accordingly, if the AM to PM vector 47 is small, the constellation point is not displaced too greatly from the ideal location and no error results.

Figure 3E:
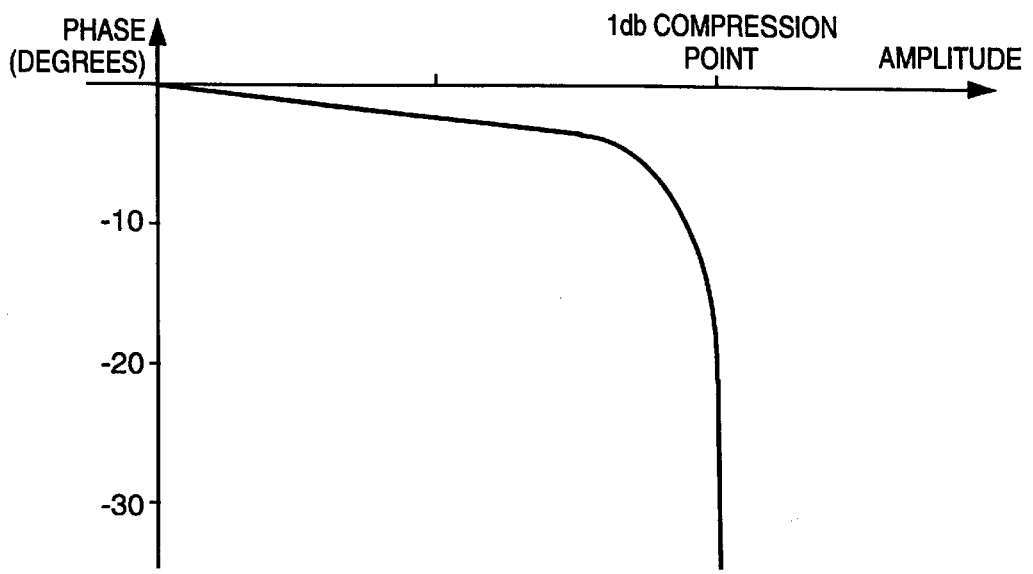
FIG. 3E is a phase plot of AM/PM conversion for a typical RF power amplifier.

However, in this particular example, the furthest constellation point from the origin 52 is subjected to a substantial error vector 47 such that the real constellation point 49 is displaced from its corresponding home constellation box 50 and into a box 51 of an adjacent constellation. Accordingly, such an error will be reproduced as an error on demodulation of that data component. Further, it will be appreciated that AM/PM conversion results in the entire constellation rotating about the origin 52 by the phase angle of the corresponding output power of the power amplifier. This is illustrated in FIG. 3E which shows how the phase angle changes as the output amplitude of the power amplifier increases, to the extent that at high amplitudes, output compression occurs which causes large phase angle errors.

Further, even small errors (as opposed to the vector 47), can be significant as they reduce the immunity the communication system has to noise. If the transmitted symbols lie in their correct locations, there is then maximum noise immunity. By shifting a symbol point half-way toward any one (or more) boundary, the noise need only be half the amplitude otherwise required to cause a decision error.

One commonly used method for overcoming the problem of phase angle errors, is to operate the RF power amplifier at approximately 10 dB below its rated output level. Accordingly, if a 1 watt transmitted power level is desired, it is necessary to obtain and operate a 10 watt transmitter at a 1 watt level. In some instances, this can represent a substantial cost difference over the required power output of a corresponding 1 watt transmitter. Further, the alternative, which is to develop a highly linear 1 watt amplifier, can be just as expensive as the cost of purchasing a 10 watt amplifier.

Another cause of phase errors is instability in the local oscillator used in translating the received QAM signal from the RF carrier frequency down to base band. Traditionally, this problem is overcome using an analog carrier recovery phase locked loop such as that shown in a QAM demodulator 60 of FIG. 4. There, an IF signal s(t) 61 is quadrature converted to base band using mixers 62 and 63. The down converted signals are then passed through Arm filters 64 and 65 respectively, which preferably perform an integrate and dump function prior to passing the signal to analog-to-digital converters (ADC's) 66 and 67, respectively. The ADC's 66 and 67 are used as the decision making device, deciding which of the $2^n$ possible I and Q values a signal is, thus providing $2^n$ output bits per symbol on data output lines 76a and 76b. Corresponding ideal signal values are then regenerated by a digital-to-analog converters (DAC's) 68 and 69, so that as far as the carrier loop is concerned, each ADC and DAC pair form a quantizer, shifting the signal amplitude to the nearest constellation point. A phase error signal is generated using two mixers 70 and 71, and a summer 72. The phase error signal is filtered in a loop filter 73 and then used to drive a voltage controlled oscillator (VCO) 74 which regenerates the carrier frequency. A quadrature phase shifter 75 supplies the carrier to one of the mixers 63. The implementation of such a demodulator for a symbol rate of 2 MHz is not readily achieved in low component count, low power technology. Further, the arrangement of FIG. 4 does not provide any automatic gain control (AGC) function which is advantageous to ensure optimal demodulation.

Figure 5:
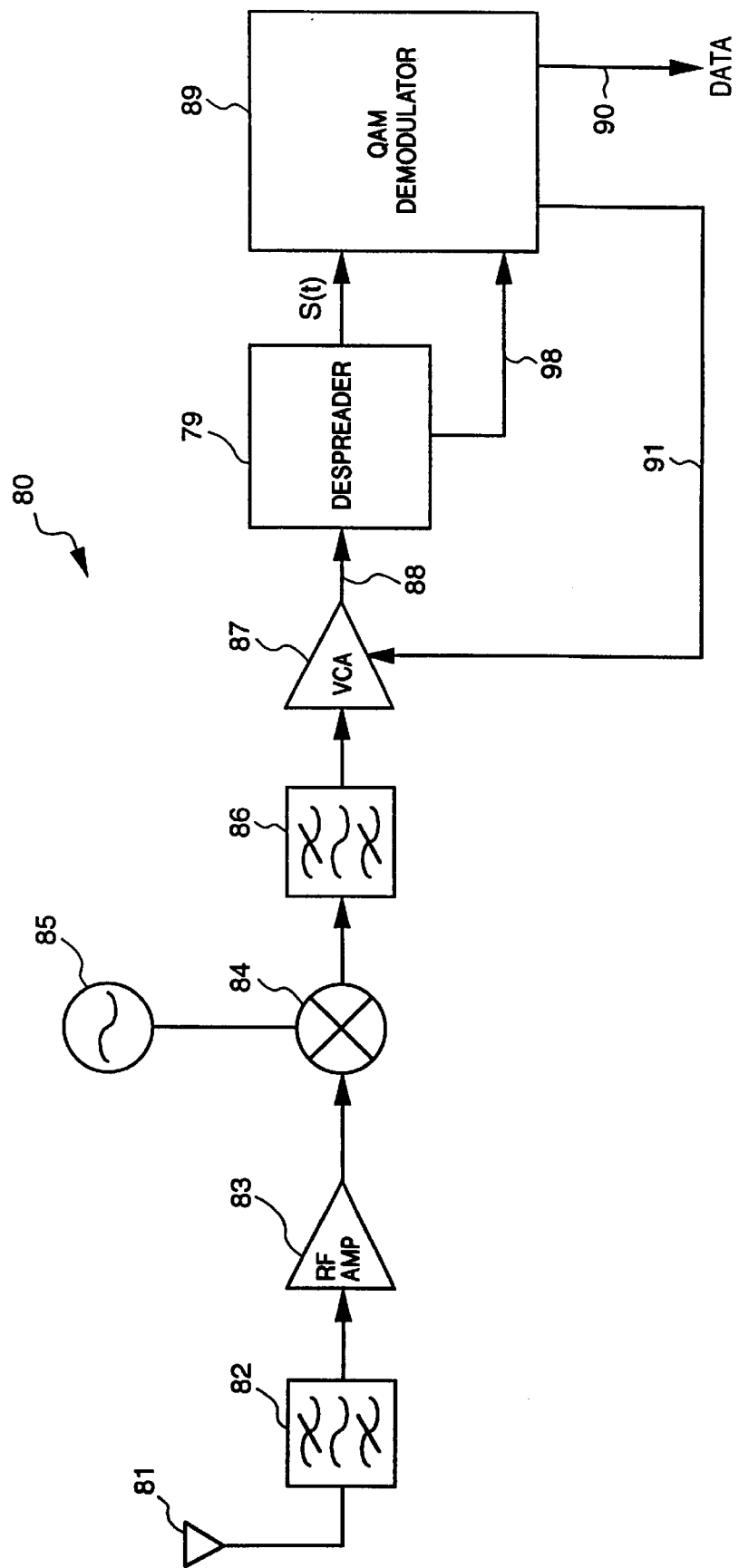
FIG. 5 is a schematic block diagram representation of an RF receiver of one embodiment.

FIG. 5 illustrates a receiver configuration 80 intended for use with the preferred embodiments and which incorporates an AGC function. An antenna 81 is arranged to receive RF transmitted signals which are passed through a RF band pass filter 82 to reduce unwanted noise. The filtered signal is then passed through a radio frequency amplifier 83 and subjected to IF mixing in a mixer 84, also input from an IF oscillator 85. The translated signal is then passed through an IF band pass filter 86 prior being input to a voltage controlled amplifier (VCA) 87. The output of the VCA 87 comprises an IF signal input s(t) 88 which is input to spread-spectrum despreading box 79 which generates a symbol synchronising pulse 98 and also passes the IF signal 88 to a QAM demodulator 89 configured in accordance with an embodiment of the present invention. The demodulator 89 provides a data output 90 as well as an AGC control voltage output 91 which supplies the VCA 87. In non-spread spectrum applications, the despreading box 79 may be substituted by a squaring device, and a band pass filter operating at the symbol frequency.

Figure 4:
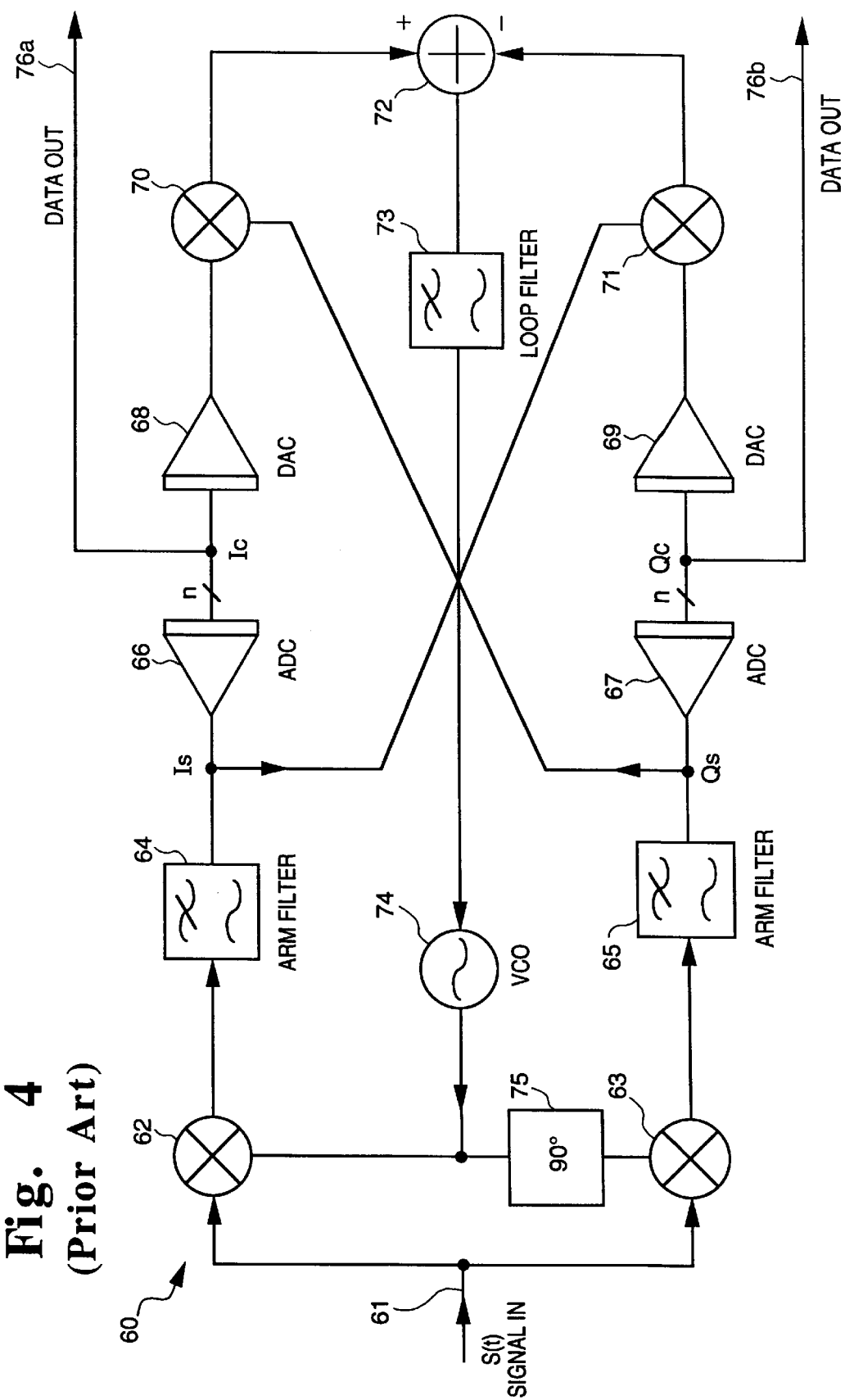
FIG. 4 illustrates a prior art QAM demodulator which incorporates carrier signal recovery.

The arrangement of FIG. 5 permits implementation of the demodulator 89 using digital signal processing (DSP) which enables an equivalent of the carrier recovery loop of FIG. 4 to be implemented at substantially reduced expense. A further advantage of such a configuration is that, through omitting the traditional VCO 74, the restriction on the VCO capture range is removed, which aids acquisition and assists to prevent false locking. Furthermore, the omission of the analog carrier recovery loop of FIG. 4 permits the use of a fixed frequency local oscillator, preferably crystal based, that affords further cost reduction. The ability to use DSP also permits the implementation of a decision-aided AGC system where the average value of the signal is not held constant. If the average power were used, the signal amplitude varies with the data pattern being transmitted and so the response time of any such AGC system must be sufficiently slow in order to average over enough symbols to attempt to obtain random data. Such a configuration is not suitable for rapid acquisition in packet-type applications.

With a decision-aided AGC system, the gain error on a symbol-by-symbol case is determined and can be used to control the VCA 87. Such an arrangement is prone to internal errors because, in order to work, the gain has to be nearly correct to start with. As such, there is no quick recovery in decision-aided AGC systems.

Figure 6:
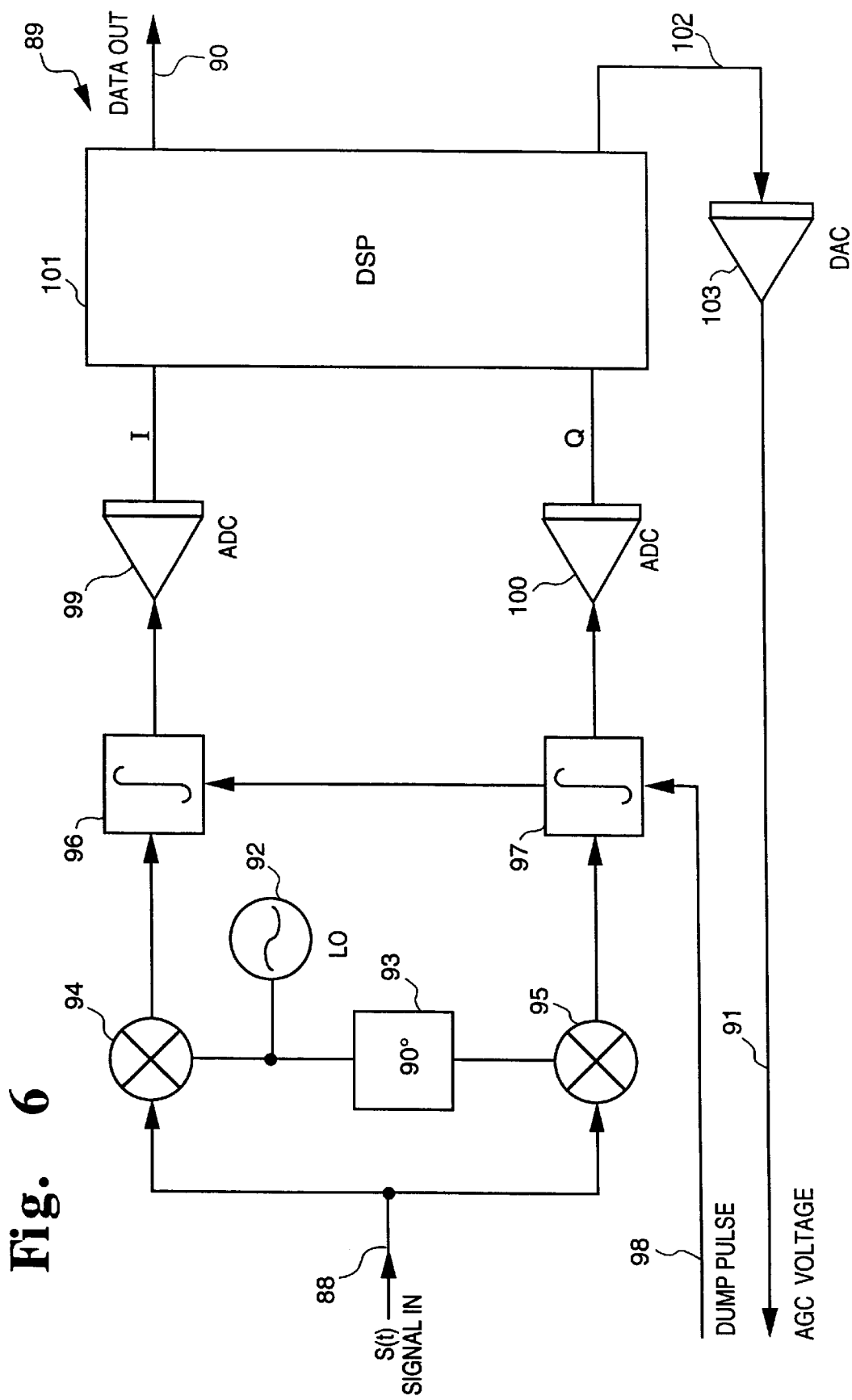
FIG. 6 is a schematic block diagram representation of a QAM demodulator which can be used in the receiver of FIG. 5 and which incorporates a QAM digital signal processor (DSP)

A generalised configuration of the QAM demodulator 89 is shown in FIG. 6 where the IF signal s(t) 88 is supplied to mixers 94 and 95 which respectively perform quadrature translation of the IF signal 88 to baseband utilising a fixed frequency local oscillator 92 and a quadrature phase shifter 93. Each of the baseband signals is then passed through a corresponding integrator 96 or 97 which is reset using the synchronising signal 98 which acts to dump the integrator outputs. The integrators 96 and 97 perform complementary functions to those of the Arm filters 64 and 65 of FIG. 4. The filtered signals are then passed through the corresponding ADC's 99 and 100 to provide the in-phase (I) and quadrature (Q) signals that are respectively supplied to a digital signal processor (DSP) 101. The DSP 101 provides a demodulator data output 90 together with an error signal 102 which is passed through a DAC 103 to provide the AGC control voltage 91.

Figure 7:
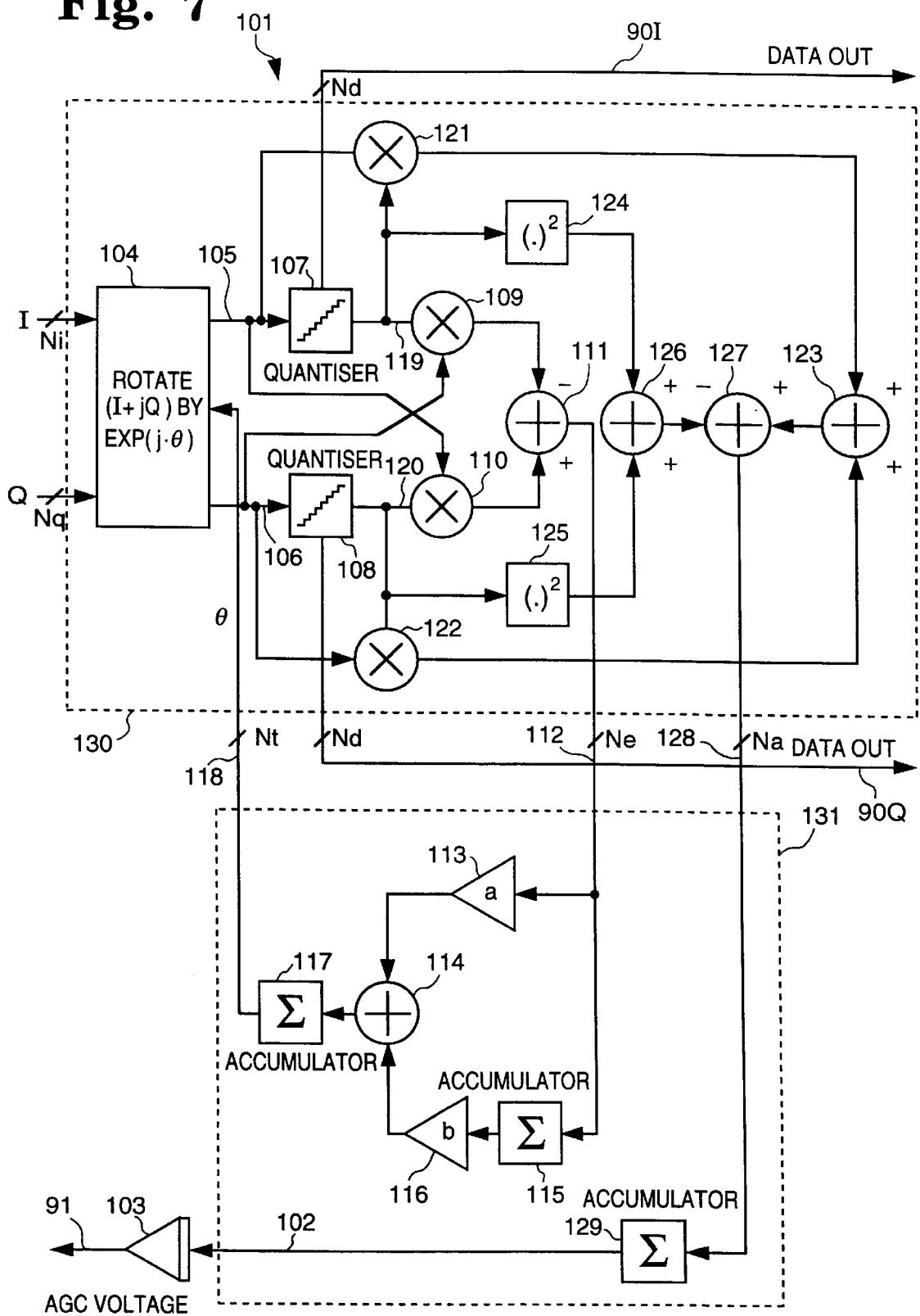
FIG. 7 is a schematic block diagram representation of the preferred QAM processing function which can be implemented in the processor of FIG. 6.

The processing function required to be performed in the preferred embodiment by the DSP 101 is indicated in FIG. 7. There, the I and Q signals are input to a complex multiplier 104 which effectively rotates (I+jQ) by exp(jΓ). The multiplier 104 has two outputs 105 and 106 which are each provided to respective quantizers 107 and 108 which respectively provide the data output components $90_I$ and $90_q$ representing the constellation points.

Having thus performed QAM demodulation, the remainder of the function of FIG. 7 is devoted to phase correction and gain control. Firstly, with reference to phase correction, each of the quantizers 107 and 108 has a corresponding further output 119 and 120 which is supplied to a corresponding mixer 109 or 110 also connected to the output 106 or 105 respectively. The mixers 109 and 110 output on an adder 111 which provides a phase error value 112. The phase error value 112, which occurs for each symbol of the constellation, is then processed to obtain the actual phase rotation angle of the constellation, as previously illustrated in FIG. 3D. This is performed by supplying the phase error value 112 to an accumulator 115 which outputs to a constant multiplier 116, the output of which is then added in a summer 114 with a value obtained from a constant multiplier 113, also input with the phase error value 112. The output of the summer 114 represents the phase error in the frequency domain, which is then applied to an accumulator 117 which converts the value into the time domain to provide the actual phase error angle θ 118 which is returned to the complex multiplier 104 to form a feedback loop. In this manner, a digital equivalent of the carrier recovery loop of FIG. 4 is achieved without the use of a voltage controlled oscillator and with a configuration that can be implemented solely with digital processing. Importantly, the digital value of phase error is used to form the carrier recovery loop which effectively performs a complex multiplication.

With reference to gain error correction, each of the quantiser outputs 119 and 120 are supplied in turn to corresponding mixer and squaring circuits 121, 124, and 122, 125 respectively. The output of each of the mixers 121 and 122, which corresponds to the amplitude of the error in the quantising process, is supplied to a summer 123. The outputs of the squaring circuits 124 and 125 are also supplied to a summer 126. The summers 123 and 126 each supply a differential summer 127 which provides a gain error value 128. The gain error value 128 is then supplied to an accumulator 129 which provides the actual gain error 102. The error 102 is then passed through the DAC 103 to provide an analog AGC control voltage 91.

The demodulation function 101 depicted in FIG. 7, whilst permitting design flexibility and accurate correction for gain and phase errors, is sufficiently complex in processing so as to prevent a desired symbol rate of 2 MHz to be achieved using lowcost DSP units.

However, as depicted, the DSP function 101 is arranged into an upper block 130 and lower block 131. Importantly, the upper block 130 provides a memory-less structure having (Ni+Nq+Nt) inputs and (2Nd+Ne+Na) outputs. In view of the demodulation function being performed upon digital values, and due to a clearly identifiable relationship between the number of inputs and outputs, a direct correlation between input and output values can be obtained suitable to permit implementation of the function 101 as a look-up table that can be realised using read-only memory (ROM) devices, when suitably programmed. In such an implementation, the important parameter of note is the actual size of the ROM, and this depends on the number of bits of resolution required for the various signals, which can be calculated empirically. However, importantly, for a 64 QAM system, good performance can be obtained using 1 megabyte ROM. Further, optimisation of the DSP function can reduce this requirement to 256 kilobytes. Also, at a proposed symbol rate of 2 mega symbols per second, the ROM access time is of the order of 500 nanoseconds, which is easily met with current technology.

The lower block 131 contains memory devices (the accumulators 115, 117 and 129) and as such is not suitable for implementation as a look-up table. The lower block 131 however can be implemented in a DSP device, or alternatively as part of a VLSI integrated circuit. Further, the memory requirements of the accumulators 115, 117 and 129 are not large and such devices only have to operate with cycle times of the order of 500 nanoseconds. Further, the gain constants "a" and "b" of the multipliers 113,116 can also be arranged in powers of two, thereby facilitating implementation using shift registers.

Figure 8:
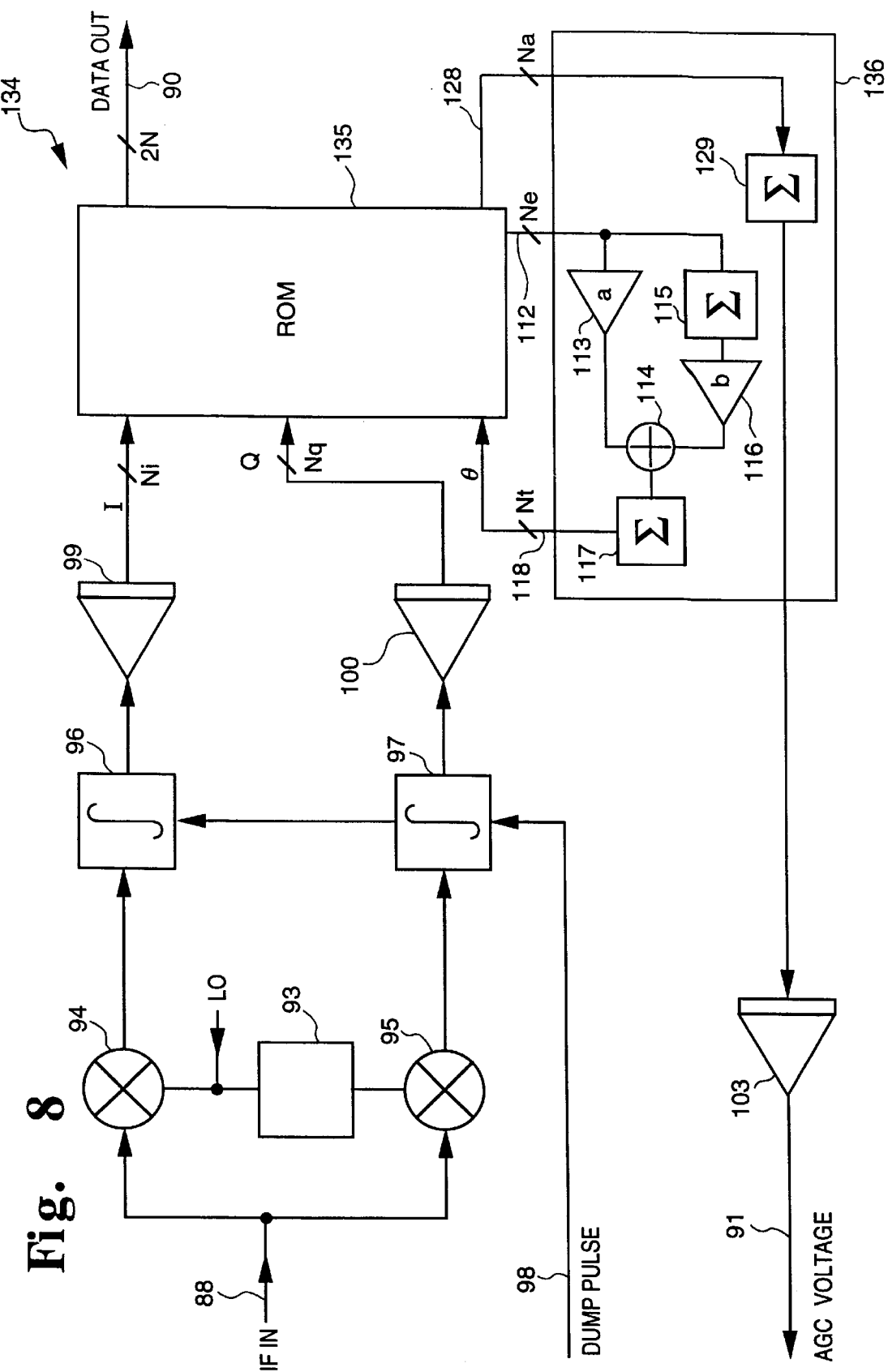
FIG. 8 is a schematic block diagram representation of a preferred embodiment of the function of FIG. 7.

FIG. 8 illustrates a QAM demodulator 134 configured to implement the demodulation function of the arrangement of FIG. 7. A ROM 135 is provided which accepts digital I and Q signals each having N bits of data. A data output 90 provides 2N bits of demodulated data comprising I and Q components, $90_I$ and $90_Q$. The ROM 135 also outputs the gain error value 128 and the phase error value 112 to a VLSI device 136 which incorporates components corresponding to those of the lower block 131 of FIG. 7. Those components output the phase angle error θ 118 which is returned as an input in a feedback loop to the ROM 135, which performs the carrier recovery operation. The provision of the gain error value 128 effectively tracks the phase offset for each amplitude of the received constellation and thus can be used to improve the Bit error rate (BER). of the demodulation system. In this embodiment, the AGC value is determined on a symbol-by-symbol basis from the gain error value 128 produced from the ROM 128. Essentially, this configuration provides for a determination of the symbol, and from that, a determination of the gain error, and thus differs from the "average" and "decision-aided" approaches referred to above. The arrangement thus acts to compensate for any AM/PM distortion in the power amplifier 4 of the transmitter 2.

It is to be noted that FIG. 8 does not illustrate any timing signals needed to control the flow of data around the ROM 35, such as latching of the ADC data, when to operate the accumulators 115,117,129, and when the output data 90 is valid. However, such details would be well understood by those skilled in the art on the basis of current existing technology. Such extra logic can be, and is preferably developed, as part of the VLSI device 136. The ROM 135 and VLSI device 136 update their states once per symbol, and for a 2 mega symbol per second system, that is every 500 nanoseconds. Thus, following the ADC devices 99 and 100 of FIG. 8, a minimum of only two integrated circuit devices would be required to complete such a 64 QAM demodulator.

An additional advantage of this technique is that other signal constellations can be handled apart from the classic square (8×8) 64 QAM constellation, illustrated in FIG. 3C. No other circuit modifications are required, only re-programming of the ROM 135. Accordingly, if a constellation has better properties that requires extremely complicated processing to determine the transmitted symbol, the gain and phase errors for the AGC and carrier recovery loops respectively can be determined offline and the results placed in a ROM.

The demodulation of a QAM signal requires tracking the phase of the received signal. Frequency offsets between the transmitter and receiver cause a regular phase change each symbol. The phase changes caused by these frequency offsets can be measured and tracked by the carrier tracking loop if the phase change per symbol is less than that needed to rotate a symbol into the decision area of a neighbour in the constellation. For QPSK, this is 45 degrees per symbol (which corresponds to a frequency offset of 250 kHz for a symbol rate of 2 MHz). For 64 QAM, the maximum change that can be tolerated is of the order of 8 degrees (the exact number depending on the data pattern) which corresponds to a frequency offset of 44 kHz for a symbol rate of 2 MHz. If the RF carrier frequency is 2.45 GHz then the maximum frequency offsets that could be tolerated would be about 102 ppm for QPSK, 18 ppm for 64 QAM, and similarly about 42 ppm for 16 QAM.

Low cost, free running, crystal oscillators typically give ±50 ppm accuracy, allowing for manufacturing tolerances and temperature and aging effects. Accordingly, with such devices, QPSK using the preferred embodiments can be supported. However, with such low cost devices, 16 QAM and 64 QAM would not appear directly supportable.

Notwithstanding the above, carrier recovery can be performed using QPSK, which can then permit switching to either 16 QAM or 64 QAM. Such a scheme is best used where the data is transmitted in packets.

As previously discussed, practical RF power amplifiers have AM/PM conversion, and also AM-AM conversion. The latter is simply gain compression and can be corrected at the transmitter using a variety of techniques, for example predistortion, being one of the simplest to implement. Further, as indicated in FIG. 2, as the transmitter is actually part of a transceiver, the corresponding receiver can be used to monitor the transmitter output and to correct the transmitted amplitudes.

The manner in which the ROM-based demodulator 134 of FIG. 8 compensates for AM to PM conversion is best understood with reference to FIG. 3D. The ROM 135 takes the received signal (I+jQ) and rotates it by the angle θ before making a decision on the constellation point received. The mechanism by which the AM to PM conversion is removed is to add a phase offset to θ prior to it being used to rotate the receive signal. This offset is a function of the signal amplitude.

The method of compensating for the AM to PM is to:
(a) determine the signal level;
(b) determine the phase offset using a look-up table; and
(c) add the phase offset to the current estimate of signal phase.

The accuracy of the compensation required depends on the accuracy with which the received constellation must be constructed. This is a function of both the level of the modulation and the required error rate.

The proposed method of measuring the signal amplitude is to incorporate it into the lookup table. If the AM to PM results in a distortion which can be estimated once, to an adequate accuracy for all transmitters likely to be received, then this distorted constellation can be directly programmed into the ROM and no further compensation is necessary.

Figure 9:
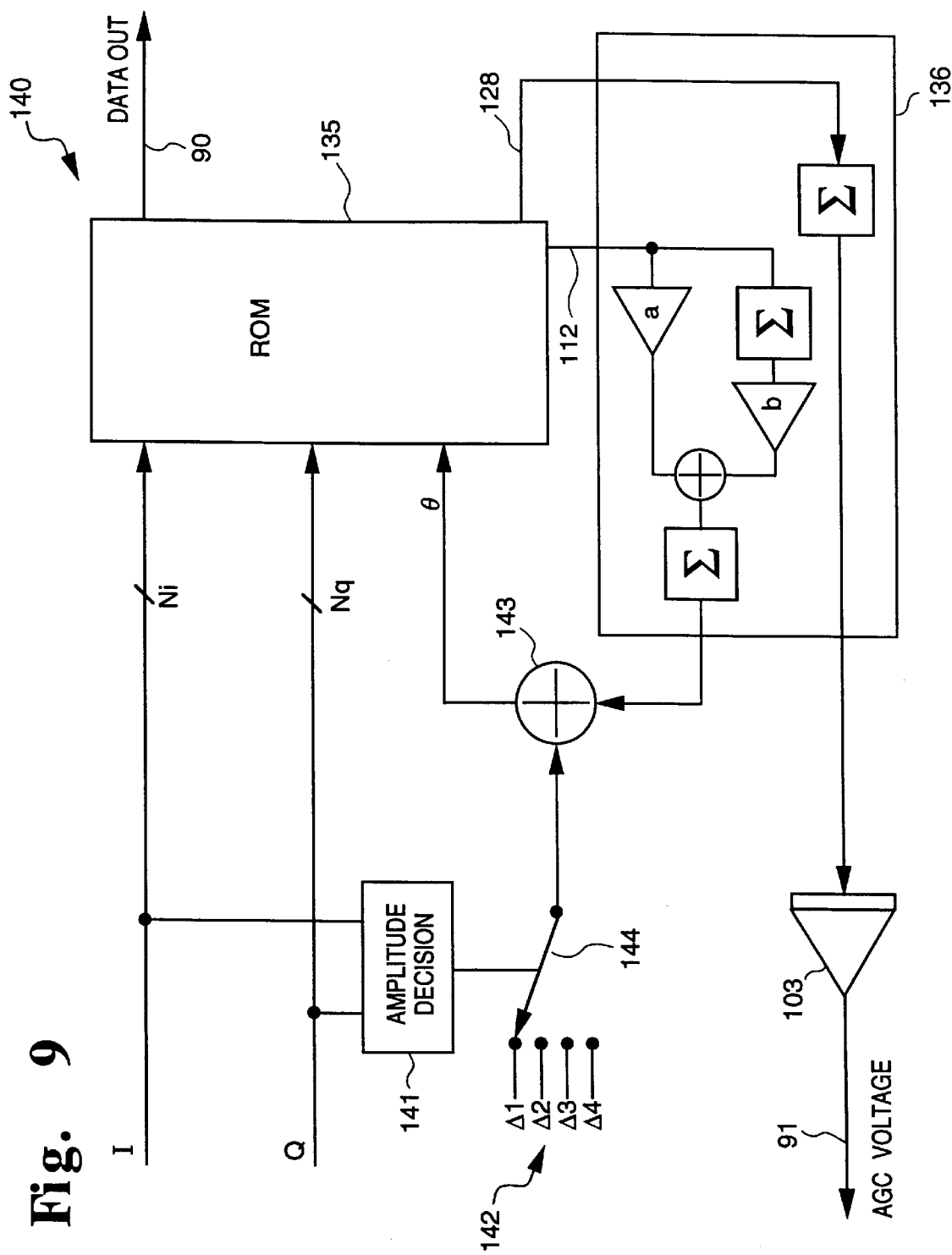
FIG. 9 is a schematic block diagram representation of an alternative embodiment of the function illustrated in FIG. 7.

Otherwise the amplitude signal must be used to select a phase offset prior to the decision process. Such an arrangement is shown in FIG. 9, where a QAM processor 140 is shown to includes an amplitude decision circuit 141 which receives the value of (I+jQ) and which controls a switch 144 to select one of four basic phase offsets 142. The selected offset is added in a summer 143 to the value output from the VLSI device 136 to give the desired phase error value θ, which is used by the ROM in the previous manner.

Thus, a demodulator including the QAM processor 140 can compensate the AM/PM distortion if it is a known quantity.

However, in practice, this must be estimated from the received signal. Preferably, this is done is by transmitting a fixed header signal on the data packet, and the AM/PM distortion is determined using the fixed header signal. Initial phase acquisition is preferably performed using QPSK, which essentially corresponds to the extreme corner constellation points in higher order systems.

Simulations indicate that using 64 QAM, if a channel raw Bit Error Rate (BER) of $10^{-5}$ is required, then the Eb/No needed by an ideal demodulator is 17.7 dB. Using the ROM demodulator proposed it is possible to achieve this error rate at Eb/No of 19.4 dB (a degradation of 1.7 dB, which can be reduced by increasing the size of the ROM). Simulating the effect of a practical power amplifier indicates that operating at 6 dB backoff gives a further degradation of 1 dB. (Hence a 4 watt amplifier is needed to transmit 1 watt).

Typical simulator results using the compensated demodulation arrangement of FIG. 9 are that if the transmitter is operated at 1 dB backoff, and the amplitude compression is corrected at the transmitter, then a phase compensation system compensating the four largest constellation points causes negligible extra degradation (ie. at 1 dB backoff using compensation the total degradation is 1.7 dB). Thus using compensation, to transmit 1 watt, only a 1.25 watt amplifier is required. As a result, it may be possible to operate with less backoff.

Wireless LAN environments have communications links that have greatly varying path loss characteristics, both due to fixed factors (eg. location relative to the base transmitter) and variable factors (eg. movement of office staff). It is possible to operate over a path with greater loss by decreasing the transmitted data rate. In the simple embodiments, the data rate can be set low enough so that communication is possible over paths with the maximum likely loss. This does not result in optimum use of the available spectrum. It is important in such an environment, that the spectral resources be optimally located to maximise network efficiency. This is achieved by:

using a low data rate for addressing and paging information, which maximises the reliability of this channel for minimal allocation of resources; and using the highest data rate possible on a channel, which often requires data rate adaption.

The QAM ROM-based demodulators of the described embodiments can be configured to switch instantly from one modulation system to another, by simply increasing the size of the ROM to include constellation information for other systems. For a 64 QAM demodulator it therefore possible, by doubling the size of the ROM, to demodulate 64 QAM, 16 QAM and QPSK. This would give relative data rates of 3:2:1 and relative performances in noise of 0:+5.5 ds:+11.9dB (allowing for Eb/No improvement and the peak power limitation of the system). That is, by dropping the data rate by a factor of ⅓, the communications link can now operate with 11.9 dB more path loss at the same error rate.

Further, the embodiments can also be arranged that the values output for the phase (112) and amplitude (128) errors are appropriately scaled to enable the same carrier recovery circuit to be used in the VLSI. No additional carrier acquisition is needed following the switch 144.

Figure 10:
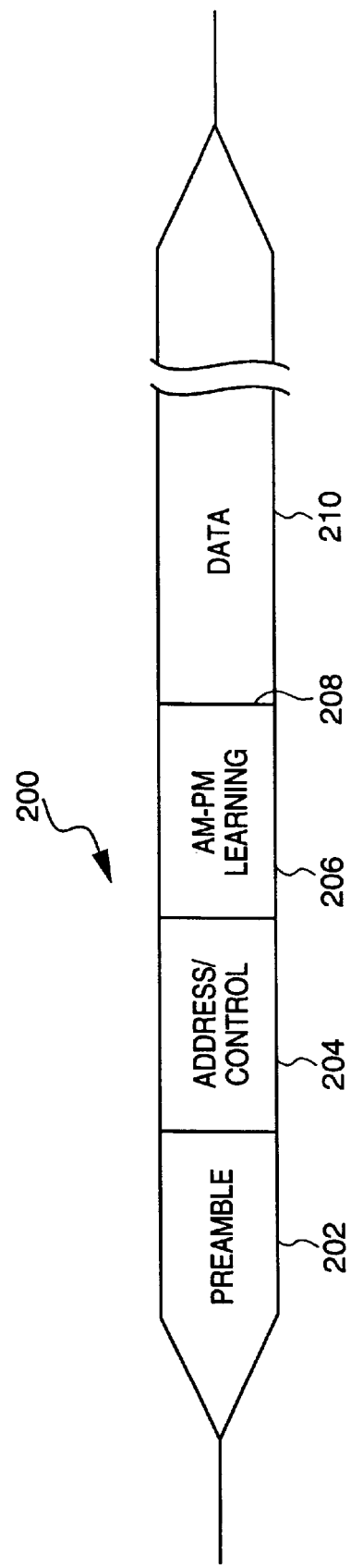
FIG. 10 illustrates a preferred transmission packet configuration for use with the preferred embodiment.

The preferred embodiment when implemented for wireless LAN has a data structure as shown in FIG. 10. The data is transmitted in packets 210, having a QPSK preamble 202 for carrier acquisition, and a QPSK header 204 containing addressing, paging and other control channel information. A short coded sequence 206 is provided for AM/PM adaption (which is preferably QPSK, and so could also carry information). An optional data rate switch 208 can then be provided before the information data 210 of the packet 200. The existence of the data rate switch 208 is required to be previously flagged, preferably in the header 204, and can be used to switch from QPSK (as preferred for the preamble 202, header 204, and learning sequence 206) to either 16 QAM or 64 QAM used in the data 210. Such a data rate switch is readily implemented in the preferred embodiments because, for each coding scheme (QPSK, 16QAM, 64QAM), the gain and phase values output from the ROM all fall within the same boundaries and thus hardware adaption is not required.

In order to optimize the described embodiments, it is desirable to reduce the size of the ROM 135. It is generally difficult to reduce the number of I and Q bits used in a QAM demodulation however, the number of θ bits can be reduced by trading them with some preprocessing. By examining the most significant θ bits the following is noted:

MSB—the most significant θ bit corresponds to a rotation of 180°;

MSB-1—the next most significant bit corresponds to a rotation of 90°;

MSB-2—the next most significant bit corresponds to a rotation of 45°; . . . and so on.

These bits can be removed from the look-up table addressing if their functionality can be provided elsewhere in the demodulation system. The MSB can be removed and replaced either by preprocessing, for example by inverting the I and Q data when the MSB is set, or by post-processing the data, for example by replacing the demodulated symbols with those 180° away. A similar operation can remove the next most significant bit. The removal of higher bits is complex due to the lack of symmetry of the constellation under rotations less than 90°. Implementation of the rotation for these bits is likely to be performed simplest using the lookup table. Two arrangements which reduce the ROM requirements from 1 megabyte to 256 kilobytes for a 64 QAM demodulator are shown in FIGS. 11 and 12.

Figure 11:
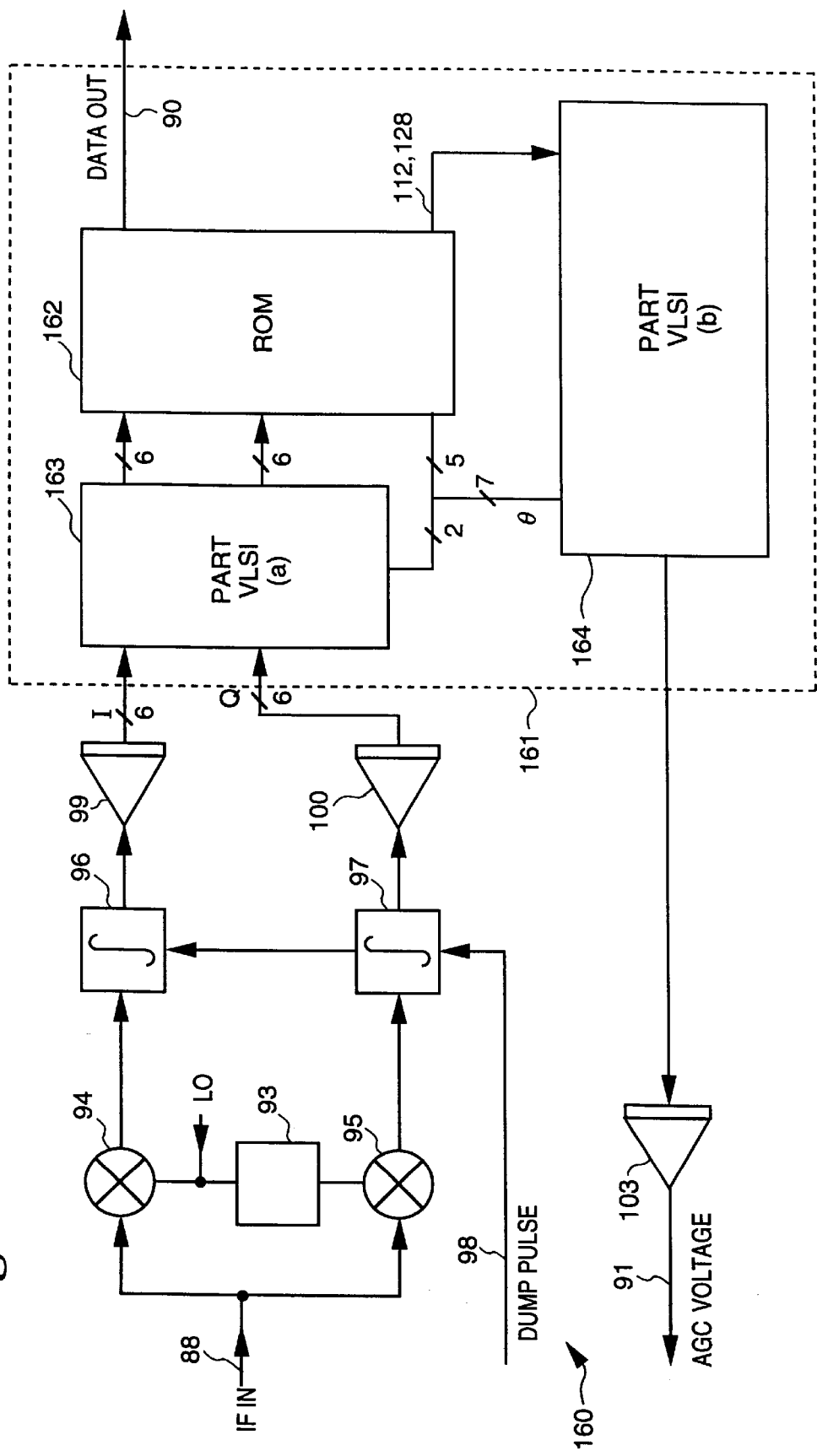
FIG. 11 illustrates a QAM demodulator of another embodiment which utilises pre-processing.

In FIG. 11, a demodulator 160 is shown in which components previously seen and similarly numbered perform corresponding functions. A QAM processor 161 is provided which incorporates a VLSI device, a first part of which (Part A) 163 is provided to receive the I and Q channels from the ADC's 99 and 100. Part A VLSI 163 forms rotations by 0°, 180° and ±90°. This requires sign changes and exchanging I and Q data. The data is then output to a reduced size ROM 162 which provides a data output 90 in the previous manner. The ROM 162 also supplies gain and phase error signals 112 and 128 to a Part B VLSI 164 which implements the corresponding function seen in FIG. 8. The only variation is that the θ value, comprising 7 bits, is divided between the VLSI Part A 163 (2 bits) and the ROM 162 (5 bits). This preprocessing technique requires minimal hardware as the rotations required provide simple sign changes and data interchanges. The processing can be made more simple if the ADC data is presented in a signed binary form.

In the configuration of FIG. 12, a demodulator 170 is provided which incorporates a QAM processor 171. The processor 171 incorporates a reduced sized ROM 173 which outputs to a VLSI device 174 which receives gain and phase error signals 112 and 128 in the previous manner and provides a θ and AGC values in the manner previously described. The QAM processor 171 performs post-processing using a second ROM 175 interposed between the data output 90 and the ROM 173 and which also receives 2 bits of the 7 bit θ signal, the remaining 5 bits being input to the ROM 173. Post-processing performs rotations by 0°, 180° and ±90°. The main ROM 173 is programmed as before except that the 5 bits of rotation using the angle θ only range from 0 to 90°. Decisions made from the ROM 173 need rotation to correct quadrant. This is performed by the second smaller ROM 175 which only requires 2 bits of θ input, thereby being able to identify the four quadrants of the constellation.

The arrangements described above permit configuration of a wireless LAN operating at a carrier frequency of about 2.45 GHz, and capable of transmitting data at a rate of 10 Mbps using a 64 QAM system.

The foregoing describes only a number of embodiments of the present invention and modifications, obvious to those skilled in the art can be made thereto without departing from the scope of the present invention.

What is claimed is:

1. A demodulation arrangement comprising:
   a mixing circuit for deriving in-phase (I) and quadrature (Q) signals in a digital form from a received signal;
   a look-up table for outputting a data output value and a corresponding phase output value, both selectable using said I and Q signals; and
   a phase processor arranged to receive said phase output value and to calculate a phase angle value of said received signal in a time domain by accumulating a phase angle value in a frequency domain; wherein
   said phase angle value in the time domain is further input to said look-up table to supplement said I and Q signals for selection of at least said data output value.

2. An arrangement as claimed in claim 1, wherein said I and Q signals provide a determination of a level of said received signal, said phase output value being derived from said table by association with said level.

3. An arrangement as claimed in claim 1, wherein said phase processor adds said phase output value to a current estimate of signal phase to provide said phase angle value.

4. An arrangement as claimed in claim 3, wherein said current estimate of signal phase is determined by a first accumulator whose weighted output is summed with a weighted version of said phase output value, the summation being subsequently summed in a second accumulator over a plurality of symbols to provide said phase angle value.

5. An arrangement as claimed in claim 4, further comprising an angle selector configured to provide a basic phase angle amount to which said phase angle value is added prior to being input to said look-up table.

6. An arrangement as claimed in claim 5, wherein said angle selector comprises an amplitude decider configured to receive said I and Q signals and therefrom determine a magnitude of said received signal, said magnitude selecting one of a plurality of said basic phase angle amounts corresponding to said magnitude.

7. An arrangement as claimed in claim 1, wherein said look-up table further comprises, and is configured to output, a gain output value selectable using said I and Q signals, said gain output value representing a gain error on a symbol-by-symbol basis.

8. An arrangement as claimed in claim 7, further comprising a third accumulator for receiving said gain output value and accumulating same over a plurality of symbols, an output of which representing a gain error of said received signal.

9. An arrangement as claimed in claim 8, further comprising a gain controllable amplifier configured to provide said received signal to said mixing means, said amplifier having a gain control input with said gain error.

10. An arrangement as claimed in claim 1, wherein said look-up table comprises a read-only memory (ROM).

11. An arrangement as claimed in claim 10, wherein said ROM is implemented in a first single package electronic device, and said phase processor is implemented in a second single package electronic device.

12. An arrangement as claimed in claim 11, further comprising a third accumulator configured within said second device for receiving said gain output value and accumulating same over a plurality of symbols, an output of which representing a gain error of said received signal, and
   wherein said look-up table further comprises and is configured to output, a gain output value selectable using said I and O signals, said gain output value representing a gain error on a symbol-by-symbol basis.

13. An arrangement as claimed in claim 11, wherein said phase processor further comprises a pre-processor configured to receive said I and Q signals and a part of said phase angle value, a remainder of said phase angle value being input to said look-up table together with associated I and Q outputs of said pre-processor, said pre-processor being configured compensate for bulk phase angle values whereby said look-up table need then only compensate for complementary discrete phase angle values.

14. An arrangement as claimed in claim 11, wherein said phase processor further comprises a post-processor configured to receive said data output values from said look-up table and a part of said phase angle value, a remainder of said phase angle value being input to said look-up table, wherein said post-processor provides associated outputs of said demodulator and is configured to compensate for bulk phase angle values whereby said look-up table need then only compensate for complementary discrete phase angle values.

15. An arrangement as claimed in claim 13, wherein said look-up table which need only compensate for the complementary discrete phase angle values is of reduced capacity compared with said read-only memory (ROM) look-up table.

16. An arrangement as claimed in claim 14, wherein said post-processor comprises a read-only memory.

17. A radio frequency receiver comprising an arrangement as claimed in claim 1.

18. A radio frequency transceiver comprising a receiver as claimed in claim 17.

19. A communications system comprising a plurality of radio frequency transceivers as claimed in claim 18.

20. An apparatus comprising:

a read-only memory (ROM) in which data values and phase values are stored for selection by I and Q input data;

a phase processor for determining, from a plurality of said phase values, a current phase angle of said I and Q input data in a time domain by accumulating a phase angle in a frequency domain; and a feedback path by which said current phase angle in the time domain is input directly to said ROM for modifying said I and Q values prior to said selection.

21. A demodulation apparatus comprising a read-only memory (ROM) configured for decoding symbol constellation points from a received signal, wherein said ROM outputs a phase output value, and a feedback path is formed from the phase output value and returning to said ROM, said feedback path implementing a digital carrier recovery loop incorporating a complex multiplication function for determining a Phase angle value of the received signal in a time domain by accumulating a phase angle in a frequency domain.

22. A method of demodulating a modulated signal, said method comprising the steps of:

(a) deriving in-phase (I) and quadrature (Q) signals from said signal;

(b) obtaining a decoded data output value and a phase output value from a (first) look-up table corresponding to said I and Q signals;

(c) determining a phase angle value of said signal in a time domain from said phase output value by accumulating a phase angle in a frequency domain; and (d) using said phase angle value in concert with said I and Q signals in the obtaining of at least said decoded data output value.

23. A method as claimed in claim 22 wherein step (b) comprises using said I and Q signals as addresses in said (first) look-up table of data output values and phase output values for selection of said decoded data output value and said phase output value, and step (d) comprises using said phase angle value as a further address to said first look-up table.

24. A method as claimed in claim 23 wherein step (c) comprises performing a predetermined processing of said phase output value external to said first look-up table.

25. A method as claimed in claim 24 wherein step (c) further comprises the steps of:

(ca) detecting an amplitude of said I and Q signals;

(cb) selecting one of a plurality of phase angle offsets using said detected amplitude; and (cc) combining the selected phase angle offset with a processed phase angle derived from said phase output value to obtain said phase angle value.

26. A method as claimed in claim 25 wherein steps (ca) and (cb) comprises inputting said I and Q signals into a (second) look-up table to select said phase angle offset from a plurality of phase angle offsets retained in said second look-up table, and step (d) comprises inputting said phase angle offset and said processed phase angle in combination to said first look-up table.

27. A method as claimed in claim 24 wherein step (b) comprises the further steps of:

(ba) inputting said decoded data output value and at least a portion of said processed phase angle into a (third) look-up table to select a specific data output value from said third look-up table.

* * * * *

UNITED STATES PATENT AND TRADEMARK OFFICE
CERTIFICATE OF CORRECTION

PATENT NO.    : 6,088,402
DATED         : July 11, 2000
INVENTOR(S)   : Peter John White Page 1 of 3

It is certified that error appears in the above-identified patent and that said Letters Patent is hereby corrected as shown below:

Title page,
Item [56], References Cited, Foreign Patent Documents, insert:
-- 6-261090    9/1994   Japan
   6-268701    9/94     Japan
   6-289124    10/94    Japan
   6-291798    10/94    Japan
   2012138     4/94     Russia
   1758899     8/92     Soviet
   2239770A    7/91     Great Britain
   59-112748   6/84     Japan
   1-188144    7/89     Japan --
Item [56], References Cited, U.S. PATENT DOCUMENTS, "5,128,960  7/1992  van Driest et al." should read -- 5,128,960  6/1992  van Driest et al. --.

Sheet No. 8,
Figure 7, "QUANTISER" (both occurrences) should read -- QUANTIZER --.

Column 1,
Line 42, "allow" should read -- allows --.

Column 3,
Line 26, "utilises" should read -- utilizes --.
Line 43, "system however," should read -- system. However, --.

Column 4,
Line 11, "effects of" ($2^{nd}$ occurrence) should be deleted.
Line 18, "increase" should read -- increases --.

Column 5,
Line 10, "a" should be deleted.
Line 31, "prior being" should read -- prior to being --.
Line 56, "were" should read -- is --.

Column 6,
Line 21, "exp (jΓ)." should read -- exp (jθ) --.
Line 54, "quantiser" should read -- quantizer --.
Line 58, "quantising" should read -- quantizing --.

Column 7,
Line 13, "realised" should read -- realized --.
Line 53, "ROM 128." should read -- ROM 135. --.

UNITED STATES PATENT AND TRADEMARK OFFICE
CERTIFICATE OF CORRECTION

PATENT NO.    : 6,088,402
DATED         : July 11, 2000
INVENTOR(S)   : Peter John White It is certified that error appears in the above-identified patent and that said Letters Patent is hereby corrected as shown below:

Column 8,
Line 12, "requires" should read -- require --.

Column 9,
Line 14, "includes" should read -- include --.
Line 21, "compensate" should read -- compensate for --.
Line 24, "is" (2nd occurrence) should be deleted.
Line 37, "1 dB. (Hence" should read -- 1 dB (hence) --.
Line 44, "(ie." should read -- (i.e., --.
Line 51, and 52, "(eg." should read -- (e.g., --.

Column 10,
Line 3, "it therefore" should read -- it is therefore --.
Line 6, "0:+5.5 ds:+" should read -- 0:+5.5 dB:+ --.
Line 38, "demodulation however," should read -- demodulation. However, --.
Line 57, "simplest using" should read -- most simply by using --.

Column 11,
Line 17, "a" should be deleted.
Line 34, "invention" should read -- invention, --.
Line 35, "art" should read -- art, --.

Column 12,
Line 34, "O" should read -- Q --.
Line 42, "compensate" should read -- to compensate --.

UNITED STATES PATENT AND TRADEMARK OFFICE
CERTIFICATE OF CORRECTION

PATENT NO. : 6,088,402
DATED : July 11, 2000
INVENTOR(S) : Peter John White

It is certified that error appears in the above-identified patent and that said Letters Patent is hereby corrected as shown below:

<u>Column 13,</u>
Line 19, "Phase" should read -- phase --.
Line 21, "comprises" should read -- comprise --.

Signed and Sealed this

Twentieth Day of November, 2001

Attest:

*Nicholas P. Godici*

NICHOLAS P. GODICI
*Attesting Officer*     *Acting Director of the United States Patent and Trademark Office*

UNITED STATES PATENT AND TRADEMARK OFFICE
CERTIFICATE OF CORRECTION

PATENT NO.    : 6,088,402
DATED         : July 11, 2000
INVENTOR(S)   : Peter John White It is certified that error appears in the above-identified patent and that said Letters Patent is hereby corrected as shown below:

<u>Title page,</u>
Item [56], References Cited, insert -- OTHER PUBLICATIONS
Fines, Panos and Aghvami, A. Hamid, "A New Medium and High Bit Rate 16-ARY QAM Demodulator for Land Mobile Satellite Communications," IEICE Transactions, Vol. 8, August, 1991, Pages 2237-2246. --

Signed and Sealed this

Thirteenth Day of August, 2002

*Attest:*

*Attesting Officer*

JAMES E. ROGAN
*Director of the United States Patent and Trademark Office*